(12) United States Patent
Ho et al.

(10) Patent No.: US 6,559,654 B2
(45) Date of Patent: May 6, 2003

(54) METHOD AND SYSTEM FOR AUTOMATIC DETERMINATION OF INDUCTANCE

(75) Inventors: Eddy Ying Yin Ho, Roanoke, VA (US); Craig William Moyer, Roanoke, VA (US); Luis Jose Garces Rivera, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/681,404

(22) Filed: Mar. 29, 2001

(65) Prior Publication Data

US 2002/0180458 A1 Dec. 5, 2002

(51) Int. Cl.[7] .............................................. G01R 23/20
(52) U.S. Cl. .................................................... 324/623
(58) Field of Search ................................. 324/623, 654, 324/76.75; 318/254, 439; 363/88; 388/801, 803; 73/862.331

(56) References Cited

U.S. PATENT DOCUMENTS

| | | | |
|---|---|---|---|
| 4,366,388 A | * 12/1982 | Wilkerson | .................. 307/150 |
| 4,812,669 A | * 3/1989 | Takeda et al. | ............... 307/105 |
| 4,843,296 A | * 6/1989 | Tanaka | ........................ 318/800 |
| 4,871,934 A | * 10/1989 | Okamoto et al. | ............ 310/166 |
| 5,032,738 A | * 7/1991 | Vithayathil | ................. 307/112 |
| 5,260,863 A | 11/1993 | Ackermann et al. | |
| 5,280,222 A | * 1/1994 | von der Heide et al. | ... 318/138 |
| 5,293,551 A | * 3/1994 | Perkins et al. | ......... 251/129.01 |
| 5,448,149 A | * 9/1995 | Ehsani et al. | ................ 318/254 |
| 5,483,615 A | 1/1996 | Hallidy | |
| 5,682,459 A | * 10/1997 | Wilkerson | ................... 318/109 |
| 5,739,652 A | * 4/1998 | Sriram | ........................ 318/138 |
| 5,757,099 A | * 5/1998 | Cheng et al. | ................ 307/105 |
| 5,780,983 A | 7/1998 | Shinkawa et al. | |
| 5,825,901 A | * 10/1998 | Hisey | .......................... 318/119 |
| 5,878,189 A | 3/1999 | Lankin et al. | |
| 5,929,400 A | * 7/1999 | Colby et al. | ................. 187/290 |
| 5,942,892 A | * 8/1999 | Li | ............................... 137/554 |
| 6,021,251 A | 2/2000 | Hammer et al. | |
| 6,031,965 A | 2/2000 | Hammer et al. | |
| 6,121,769 A | * 9/2000 | Mukai et al. | .......... 324/207.12 |
| 6,166,929 A | 12/2000 | Ma et al. | |
| 6,191,929 B1 | * 2/2001 | Hoffmann et al. | ........... 361/152 |

* cited by examiner

*Primary Examiner*—Christine Oda
*Assistant Examiner*—John Teresinski
(74) *Attorney, Agent, or Firm*—Hunton & Williams

(57) ABSTRACT

A method and system for determining an inductance value of an inductive element are presented. The method includes energizing the inductive element using an N-pulse AC to DC converter in electrical communication with the inductive element and an AC source. The method further includes determining at each of a plurality of periodic time intervals an inductive element voltage value, an inductive element current value, and an equivalent source phase angle. An Nth harmonic impedance squared value is then determined for the inductive element using the inductive element voltage and current values and the equivalent source phase angles. The inductive element inductance value is then calculated using the Nth harmonic impedance squared value and an AC source frequency value.

53 Claims, 12 Drawing Sheets

METHOD AND SYSTEM FOR AUTOMATIC DETERMINATION OF INDUCTANCE

BACKGROUND OF INVENTION

This invention relates to the measurement of operating parameters of DC motors. More particularly, the invention relates to a method of determining the inductance of inductive elements driven by an AC to DC converter.

When a new motor is commissioned, it is highly desirable to establish the baseline characteristics of the motor. In this regard, the operational armature inductance (i.e., the inductance of the armature when the associated field winding is energized to an operational current level) is of particular importance. As is well known, the inductance of the motor armature decreases with increasing field current. As a result, the armature inductance level with no field current can be 100–200% greater than the saturated armature inductance level. Pre-commission armature inductance measurement conducted without a field current is therefore inadequate for use in tuning motors having high saturation characteristics.

Accordingly, armature inductance must be determined during commissioning with the associated field current at an operational level. In order to avoid shaft movement, which may cause overspeed or damage to load equipment, the usual method for determining operational armature inductance requires that the motor shaft be locked in place. The operational field current is then established and a step current applied to the armature. The armature inductance is determined based on the response of the actual armature current to the step input.

The above-described method of determining armature inductance can be highly time consuming because it requires that the motor shaft be locked and it requires that trending of various step current responses be carried out. With some motors and installations, the inductance measurement task can increase commissioning time by as much as a day.

SUMMARY OF INVENTION

There is accordingly a need for a method of determining an operational armature inductance value for a converter-driven DC motor that does not require that the shaft of the motor be locked in place.

A method for determining an inductance value of an inductive element is provided that includes energizing the inductive element using an N-pulse AC to DC converter in electrical communication with the inductive element and an AC source. The method further includes determining at each of a plurality of periodic time intervals an inductive element voltage value, an inductive element current value, and an equivalent source phase angle. An Nth harmonic impedance squared value is then determined for the inductive element using the inductive element voltage and current values and the equivalent source phase angles. The inductive element inductance value is then calculated using the Nth harmonic impedance squared value and an AC source frequency value.

BRIEF DESCRIPTION OF DRAWINGS

The present invention can be more fully understood by reading the following detailed description of presently preferred embodiments together with the accompanying drawings, in which like reference indicators are used to designate like elements, and in which.

DETAILED DESCRIPTION

The present invention uses the Nth harmonic voltage and current of an inductive element driven by an N-pulse AC to DC converter to determine the inductance of the inductive element. The term inductive element is used herein to describe any component of an electrical circuit or system that exhibits an appreciable degree of electromagnetic induction. As long as the inductance level is not so large that the resulting harmonic current cannot be distinguished, the method of the present invention can be used to determine the inductance of any inductive element ranging from a simple inductor to a motor armature. Of particular importance is the capability of the method to determine the inductance of a motor armature when subjected to operational field current levels.

When used in a motor system, the method can be used to determine armature inductance under an operational field current in less than one cycle of the AC source. As a result, the armature need only be energized under field current for a very short time interval. This time interval may in fact be so short that there is no significant movement of the motor shaft. Ideally, the interval is short enough that the rotational force applied to the motor shaft is insufficient to overcome the static friction force that keeps the shaft from rotating. The armature inductance under operational field current can thus be determined without locking the shaft.

It is well known to pass AC current through a thyristor bridge converter to energize the armature of a DC motor.

The current is supplied to the armature in the form of unidirectional pulses, the number, timing and duration of which can be varied based on the firing commands provided to the thyristors in the converter. The resulting armature voltage and current contains a high degree of Nth harmonic content, where N is the number of output pulses per cycle of the AC voltage source.

Figure 1:
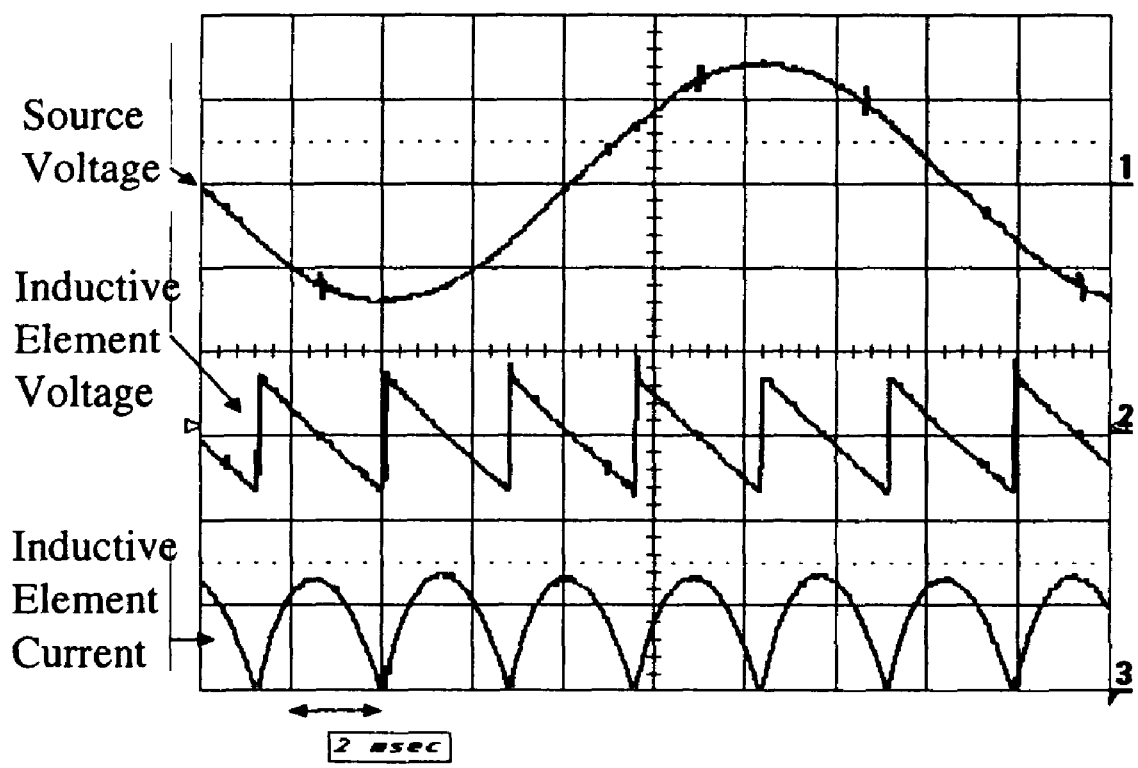
FIG. 1 is a graphical representation of inductive element voltage and current response to a 6-pulse AC to DC converter input.

Other inductive elements may be similarly driven. FIG. 1 is an illustrative example of the voltage and current response of a typical inductive element to a three phase AC supply voltage passed through a 6-pulse converter using a constant 90 degree firing angle. (Only one phase of the supply voltage is illustrated for clarity.) It will be understood by those having ordinary skill in the art that the harmonic frequency of interest will be N times the fundamental frequency of the AC source, where N is the number of converter pulses per cycle. In the illustrated example, the harmonic frequency of interest is six times that of the fundamental wave form of the AC source. For a 12-pulse converter, the harmonic frequency of interest is 12 times the fundamental frequency.

The inductance of the inductive element can be calculated by discriminating out the Nth harmonic components of voltage and current to allow the calculation of Nth harmonic impedance and reactance. The inductance can be computed from the harmonic reactance and the source frequency using the following relationship:

$$L_{ind} = \frac{X(N)}{N(2\pi)f} \quad \text{Eq. 1}$$

where

N=number of converter pulses per source AC cycle;

X(N)=Nth harmonic reactance of the inductive element;

$L_{ind}$=inductance; and $f$=source frequency.

The Nth harmonic reactance is a function of the Nth harmonic impedance and the resistance of the inductive element according to the following relationship:.

$$X(N) = \sqrt{Z(N)^2 - R_{ind}^2} \quad \text{Eq. 2}$$

where

Z(N)=Nth harmonic impedance of the armature;

$R_{ind}$=inductive element resistance value.

Equations 1 and 2 can be combined to form a single equation for inductance as a function of the Nth harmonic impedance, inductive element resistance and source frequency as follows:

$$L_{ind} = \frac{\sqrt{Z(N)^2 - R_{ind}^2}}{N(2\pi)f} \quad \text{Eq. 3}$$

The Nth harmonic impedance is, in turn, a function of the Nth harmonic voltage and current according to the following relationship:

$$Z(N)^2 = \frac{V(N)^2}{I(N)^2} \quad \text{Eq. 4}$$

where

V(N)=Nth harmonic voltage of the inductive element; and

I(N)=Nth harmonic current of the inductive element.

Combining Equations 3 and 4 produces the following relationship:

$$L_{ind} = \frac{\sqrt{\frac{V(N)^2}{I(N)^2} - R_{ind}^2}}{N(2\pi)f} \quad \text{Eq. 5}$$

Nth harmonic voltage and current values can be calculated for a particular time interval of interest using periodically determined values of inductive element voltage and current along with the phase angle of the AC source. For m measurements taken at regular time intervals, the Nth harmonic voltage and current values can be determined using the following relationships:

$$V(N)^2 = [\Sigma_{i=0}^{i=m}[V_i \cos(mod_{2\pi}(N\alpha_i))]]^2 + [\Sigma_{i=0}^{i=m}[V_i \sin(mod_{2\pi}(N\alpha_i))]]^2; \quad \text{Eq. 6}$$

$$I(N)^2 = [\Sigma_{i=0}^{i=m}[I_i \cos(mod_{2\pi}(N\alpha_i))]]^2 + [\Sigma_{i=0}^{i=m}[I_i \sin(mod_{2\pi}(N\alpha_i))]]^2; \quad \text{Eq. 7}$$

where m=a number of periodic determinations of inductive element voltage and current and of source angle;

i=an integer time interval counter varying from 0 to m;

$V_i$=ith inductive element voltage value;

$\alpha_i$=ith source phase angle; and $I_i$=ith inductive element current.

The average resistance of the inductive element can be determined for a particular interval as follows:

$$R_{arm} = \frac{\sum_{i=0}^{i=m} V_i}{\sum_{i=0}^{i=m} I_i} \quad \text{Eq. 8}$$

where m=a number of periodic determinations of inductive element voltage and current;

i=an integer time interval counter varying from 0 to m;

$V_i$=ith inductive element voltage value; and $I_i$=ith inductive element current.

It will be understood by those having ordinary skill in the art that the harmonic impedance will typically be much higher than the resistance. As a result, the resistance squared term in equations 2, 3 and 5 can often be neglected. Equation 3 is then reduced to:

$$L_{ind} = \frac{\sqrt{Z(N)^2}}{N(2\pi)f} = \frac{Z(N)}{N(2\pi)f} \quad \text{Eq. 9}$$

and equation 5 is reduced to:

$$L_{ind} = \sqrt{\frac{V(N)^2}{I(N)^2}} * \frac{1}{N(2\pi)f} = \frac{V(N)}{I(N)} * \frac{1}{N(2\pi)f}. \quad \text{Eq. 10}$$

Figure 2:
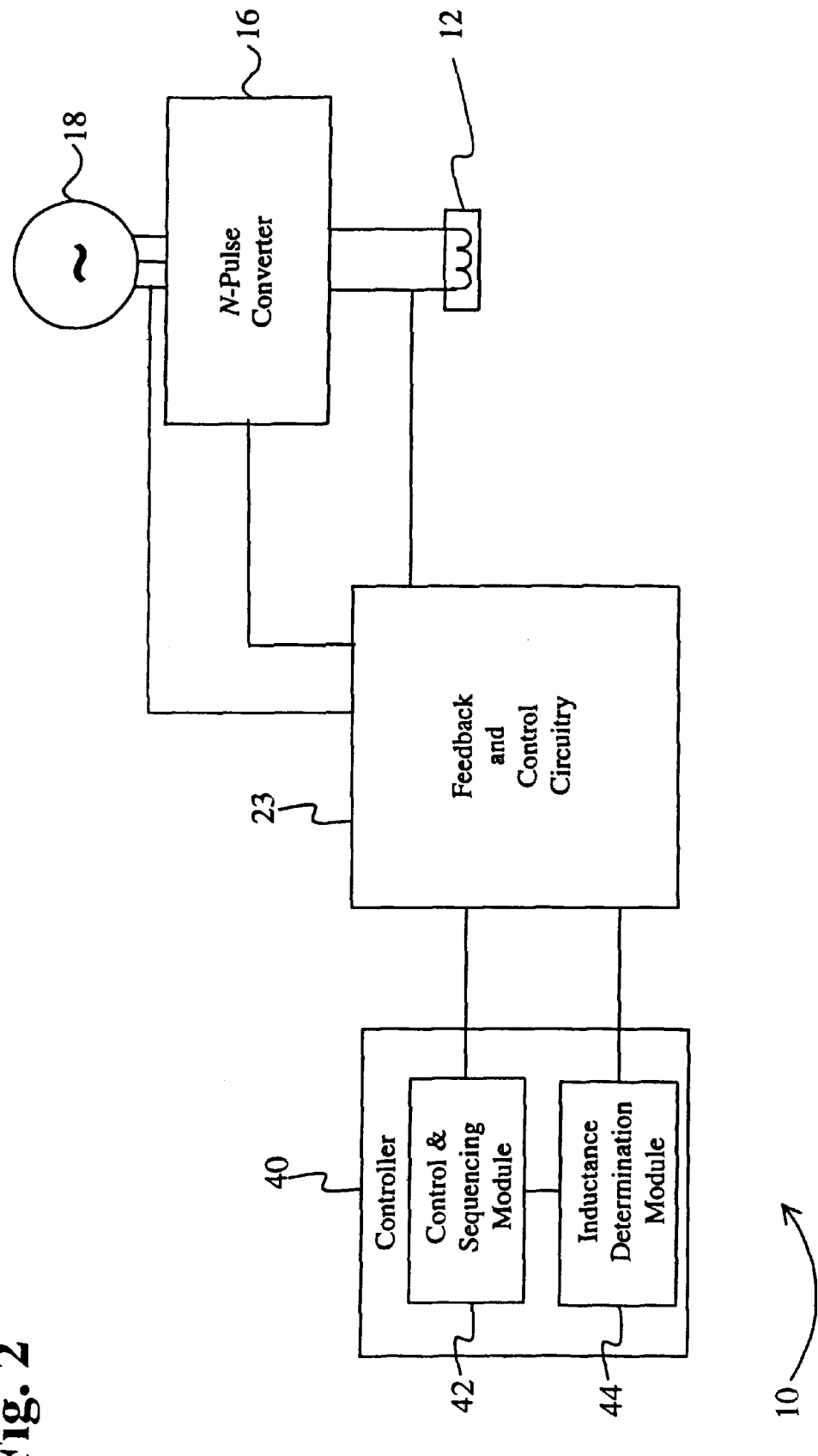
FIG. 2 is a block diagram of an induction determination system according to an embodiment of the present invention.

A block diagram of an inductance determination system 10 that uses the above relationships to determine the inductance of a simple inductor is shown in FIG. 2. In this system 10, an inductor 12 is driven by a three-phase AC source 18, the current and voltage of which are converted to pulsed DC current and voltage by an N-pulse AC to DC converter 16.

Operation of the converter 16 is controlled through a combination of automatic control provided by feedback and control circuitry 23 and a digital controller 40. As will be discussed in more detail hereafter, the feedback and control circuitry 23 converts inductor voltage and current and AC line voltage measurements to digital feedback signals. The controller 40 includes a control and sequencing module 42 and an inductance determination portion 44. The control and sequencing module 42 provides command signals to the feedback and control circuitry 23 and data acquisition sequencing information to the inductance determination module 44. The inductance determination module 44 uses feedback signals from the feedback and control circuitry 23 and sequencing information from the control and sequencing module 42 to determine the Nth harmonic impedance and the inductance of the inductor 12.

The controller 40 may be in the form of any programmable data processor, signal processor or programmable logic controller. It will be understood by those having ordinary skill in the art that any of various devices, systems or techniques may be used for communication between the controller 40 and the feedback and control circuitry 23, including, for example, a local area network (LAN).

Figure 3:
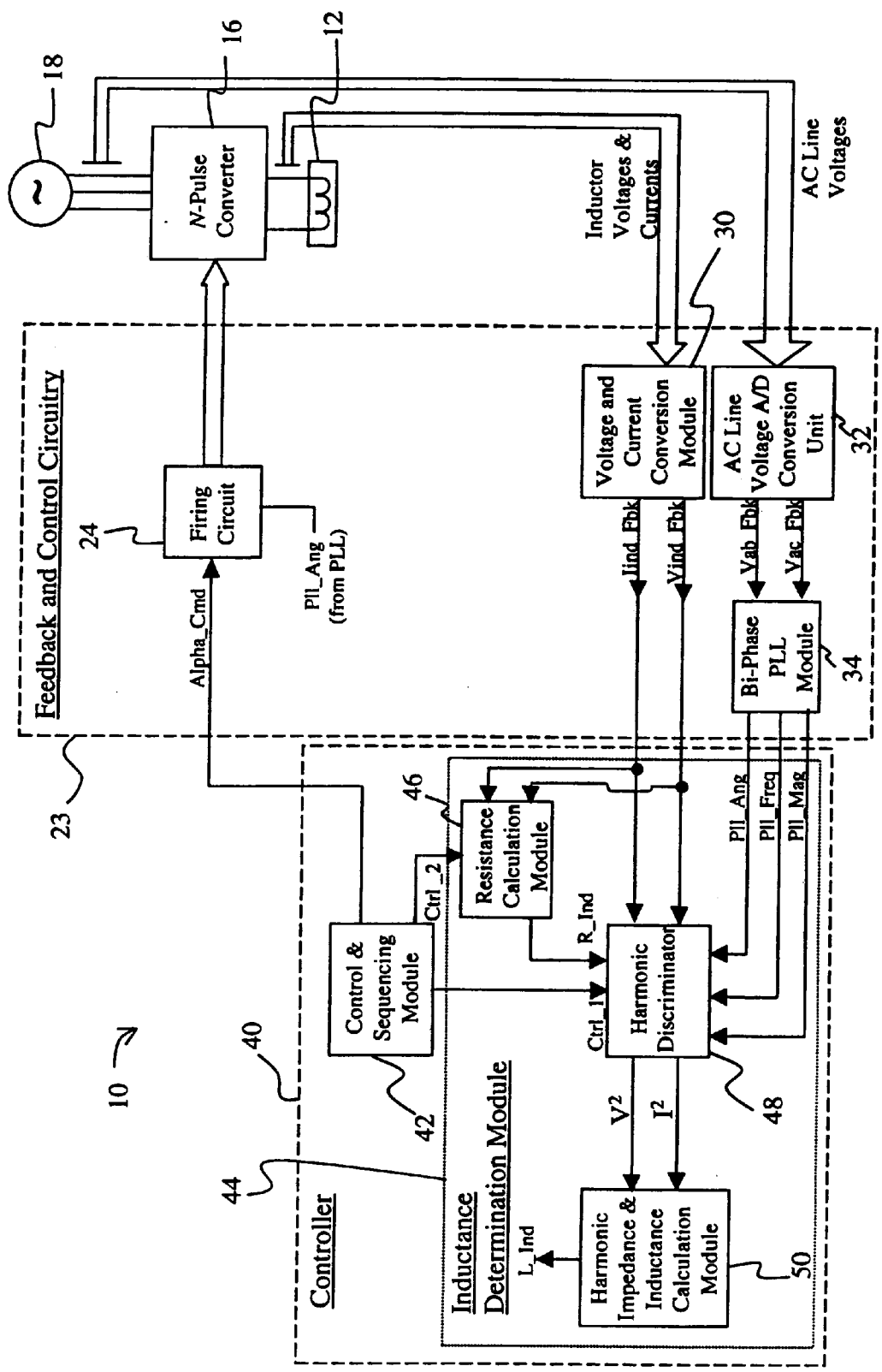
FIG. 3 is a more detailed block diagram of the induction determination system depicted in the block diagram of FIG. 2.

The inductance determination system 10 will now be discussed in more detail. As shown in FIG. 3, the feedback and control circuitry 23 includes a voltage and current conversion module 30 that converts voltage and current measurements to digital feedback signals. The inductor voltage and inductor current are converted to an inductor voltage feedback signal (Vind_Fbk) and an inductor current feedback signal (Iind_Fbk), respectively using a combination of current shunts and analog to digital (A/D) converters as is well known in the art.

The feedback and control circuitry 23 also includes a line voltage analog to digital conversion unit 32 that converts analog signals to digital voltage feedback signals (Vab_Fbk and Vac_Fbk). These signals are used by a bi-phase, phase-lock loop (PLL) module 34 to produce effective source phase angle (Pll_Ang), frequency (Pll_Freq) and voltage (Pll_Mag) signals. As is well known in the art, the PLL module 34 compares the differences of the instantaneous magnitudes of the two AC line voltage inputs. From this information, it calculates the effective phase angle (Pll_Ang) of the three-phase AC line source 18. The Pll_Ang signal is used by the firing circuit 24 to coordinate and adjust converter firing time signals.

The N-pulse armature converter 16 includes a plurality of thyristors that can be fired in a predetermined sequence to convert the AC wave form from the AC source 18 into a series of voltage pulses similar to those illustrated in FIG. 1. The thyristor bridge circuit is configured to provide a predetermined number (N) of pulses per AC source cycle. The firing rate and sequence is controlled by the firing circuit 24 based on a firing angle command (Alpha cmd) provided by the control and sequencing module 42. Based on this command and on feedback of the AC source phase angle, the firing circuit 24 provides thyristor gate states and firing times to the converter 16.

The controller 40 includes the control and sequencing module 42 and the inductance determination module 44. The control and sequencing module 42 can be configured to provide a predetermined firing angle command or can be programmed for interactive input of firing angle. As discussed in more detail hereafter, the control and sequencing module 42 also controls the rate and duration of data acquisition for inductance determination.

The inductance determination module 44 includes three major subcomponents: the resistance calculation module 46, the harmonic discriminator 48 and the impedance/inductance calculation module 50. The resistance calculation module 46 uses the relationship of Equation 8 and the inductor voltage and current feedback signals to calculate an inductor resistance. The control and sequencing module 42 determines the number and frequency of resistance values to average. A control signal (Ctrl_2) from the control and sequencing module is used to turn the resistance calculation module 46 on and off at the appropriate sample times.

As discussed above, inductor resistance may sometimes be neglected. The resistance calculation module 46 can thus be deleted or bypassed if it is determined that the inductor resistance value will be negligible compared to the Nth harmonic impedance value. Alternatively, a fixed resistance value can be loaded into the controller 40 for use by the inductance determination module 44.

The harmonic discriminator 48 uses the relationships of Equations 6 and 7 to calculate the squares of the Nth harmonic inductor voltage and Nth harmonic inductor current. The calculations are made periodically over a predetermined time interval as commanded by the control and sequencing module 42 through a control signal (Ctrl_1). The harmonic discriminator 48 uses inductor voltage and current feedback values from the voltage and current conversion module 30 and source phase angle values from the PLL module 34.

The impedance/inductance calculation module 50 uses the squares of the Nth harmonic inductor voltage and current to compute the Nth harmonic impedance using Equation 4. If the Nth harmonic impedance is desired only as an interim calculation, the impedance calculator need only calculate the square of the Nth harmonic impedance, which can be entered directly into the inductance calculation.

Finally, the impedance/inductance calculation module 50 uses the square of the Nth harmonic impedance, the frequency of the AC source 18, the output resistance (R_ind) of the resistance calculation module 46, and the relationship of Equation 3 to calculate the inductance of the inductor 12. The source frequency used can either be a pre-set value or the frequency provided by the PLL module 34. It will be understood by those having ordinary skill in the art that over short time intervals, there is little variation in AC source frequency. As a result, any error introduced by the use of a constant, pre-set source frequency is small.

If the inductor resistance is not available or is not to be used, the impedance/inductance calculation module 50 calculates the Nth harmonic voltage and current by calculating the square roots of the values obtained using Equations 6 and 7. The inductor inductance is then determined using the Nth harmonic voltage and current values, the frequency of the AC source 18 and the relationship of Equation 10 to calculate the inductance of the inductor 12.

Figure 4:
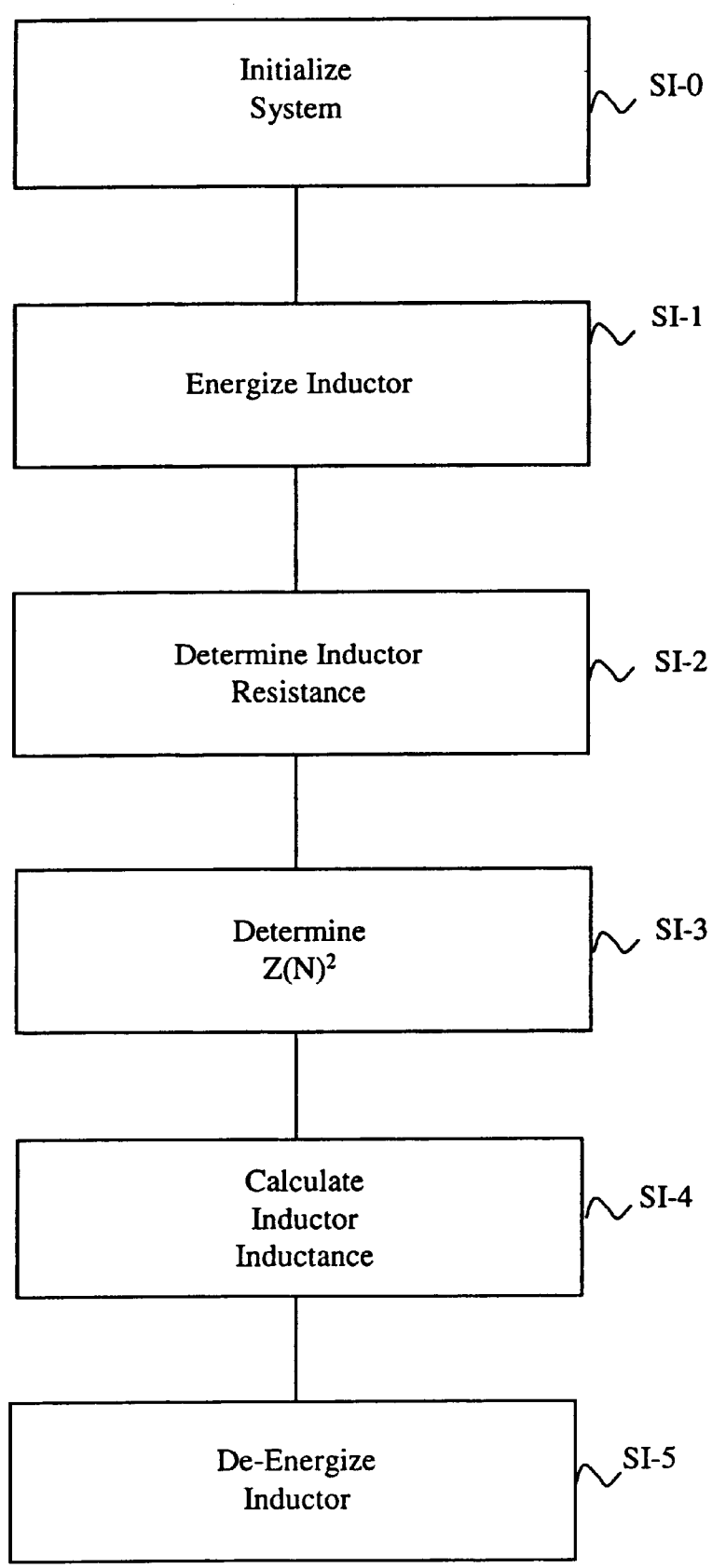
FIG. 4 is a flowchart of the steps of a method according to one embodiment of the invention.

The basic steps of a method of determining inductance using the inductance determination system 10 are shown in FIG. 4. Initially, at step SI-0, the inductor 12 is not energized and all voltage and current feedback offsets are nulled. At step SI-1, the inductor 12 is energized by the N-pulse converter 16, which uses a constant firing angle supplied to the firing circuit 24 by the controller 40. At step SI-2, the control and sequencing module 42 commands the resistance calculation module 46 to determine inductor resistance. Step SI-2 can, of course, be eliminated if the inductor resistance is known or need not be calculated. At steps SI-3 and SI-4, the control and sequencing module 42 commands the inductance determination module 44 to determine the harmonic impedance squared and the inductor inductance, respectively. Step SI-3 includes determining values for inductive element voltage and current and for the equivalent source phase angle based on measurements taken at regular periodic intervals. At step SI-5, the inductor is de-energized.

The control and sequencing module 42 is programmed to control the above sequence of events in such a way as to minimize the time required for each step. This becomes particularly significant when the system is used to determine the inductance of a motor armature as is discussed below. The length of the resistance determination step is driven by the number of data points required to obtain a reliable resistance value. It has been determined that with a 60 Hertz system and a resistance sampling rate of 4000 data points per second, 20 cycles of data sampling provides adequate results.

With respect to Nth harmonic impedance determination, the theoretical minimum requirement would be to obtain samples for 1/N cycles. In order to reduce error potential due to noise disturbance, however, it is preferred that data be obtained for 3/N cycles. Accordingly, for a six-pulse motor system, data need be obtained for only a half cycle. With a 60 Hertz source and a sampling rate of 4000 data points per second, this equates to 33 data points.

Figure 5:
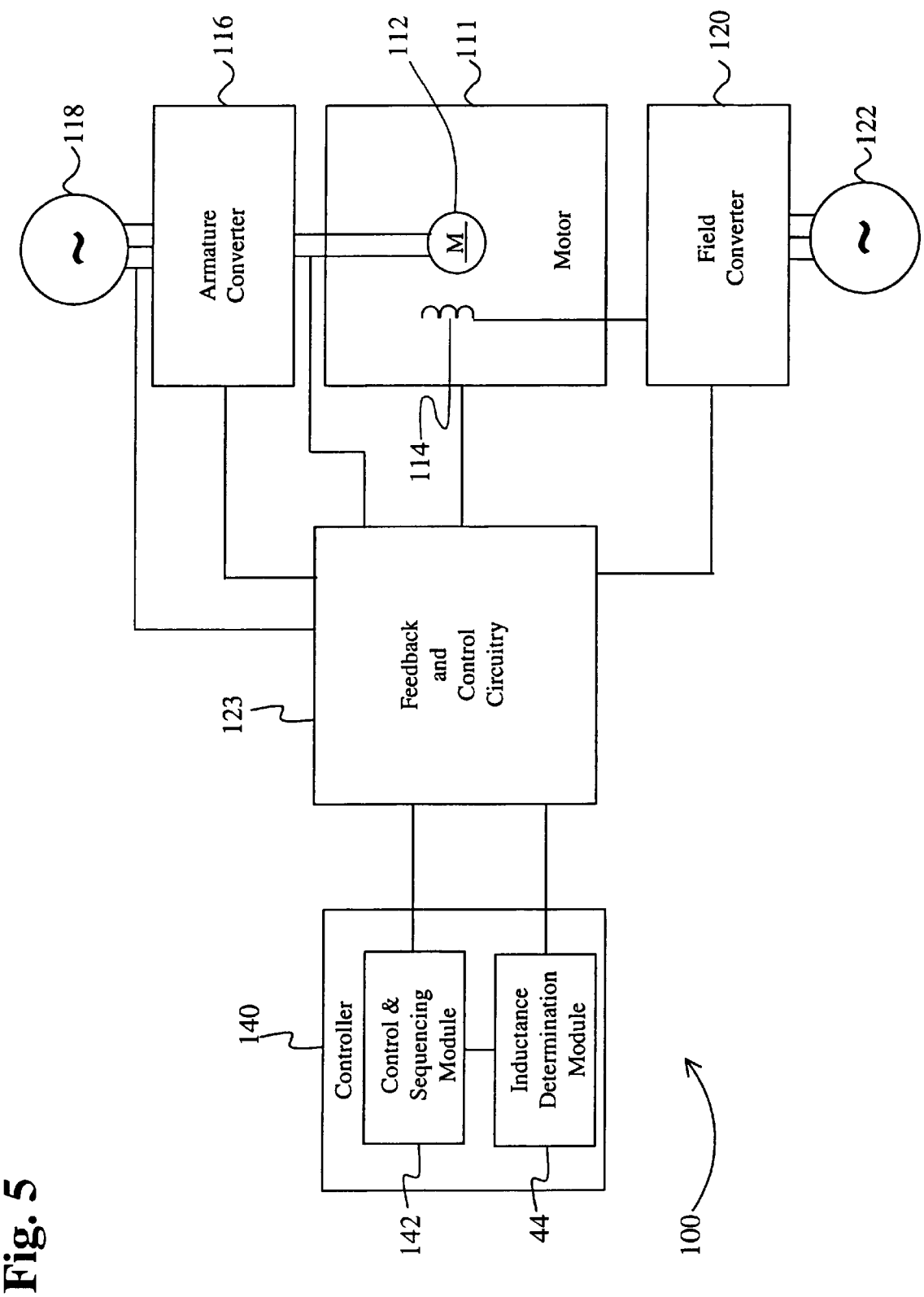
FIG. 5 is a block diagram of an electric motor system according to an embodiment of the present invention.

Another embodiment of the present invention provides a motor and control system that uses harmonic impedance to determine the operational armature inductance of the motor. FIG. 5 shows a block diagram of an illustrative embodiment of a motor/control system 100 according to the present invention. In this motor/control system 100, a DC motor 111 includes an armature 112 and an associated field winding 114. The armature 112 is configured to drive a motor shaft (not shown) that is generally free to rotate or is coupled to a load. The armature 112 is driven by a first three-phase AC source 118, the current and voltage of which are converted to pulsed DC current and voltage by the N-pulse armature converter 116. The field winding 114 is powered by current from a second three-phase AC source 122 converted to DC by the field converter 120. It will be understood by those having ordinary skill in the art that, while two separate AC sources are shown and discussed herein, the armature 112 and the field winding 114 may be powered by current from a single AC source. It will also be understood that a single-phase or two-phase AC source may be used for either the armature source 118 or the field source 122.

Operation of the motor 111 is controlled through a combination of automatic control provided by the feedback and control circuitry 123 and a digital controller 140. The controller 140 differs from the controller 40 of the previously described system in that the control and sequencing module 142 is configured to provide a field current command signal to the field current regulator 128. The inductance determination module 44 is unchanged. As before, the inductance determination module 44 uses feedback signals from the feedback and control circuitry 123 and sequencing information from the control and sequencing module 142 to determine the Nth harmonic impedance and the inductance of the armature 112.

Figure 6:
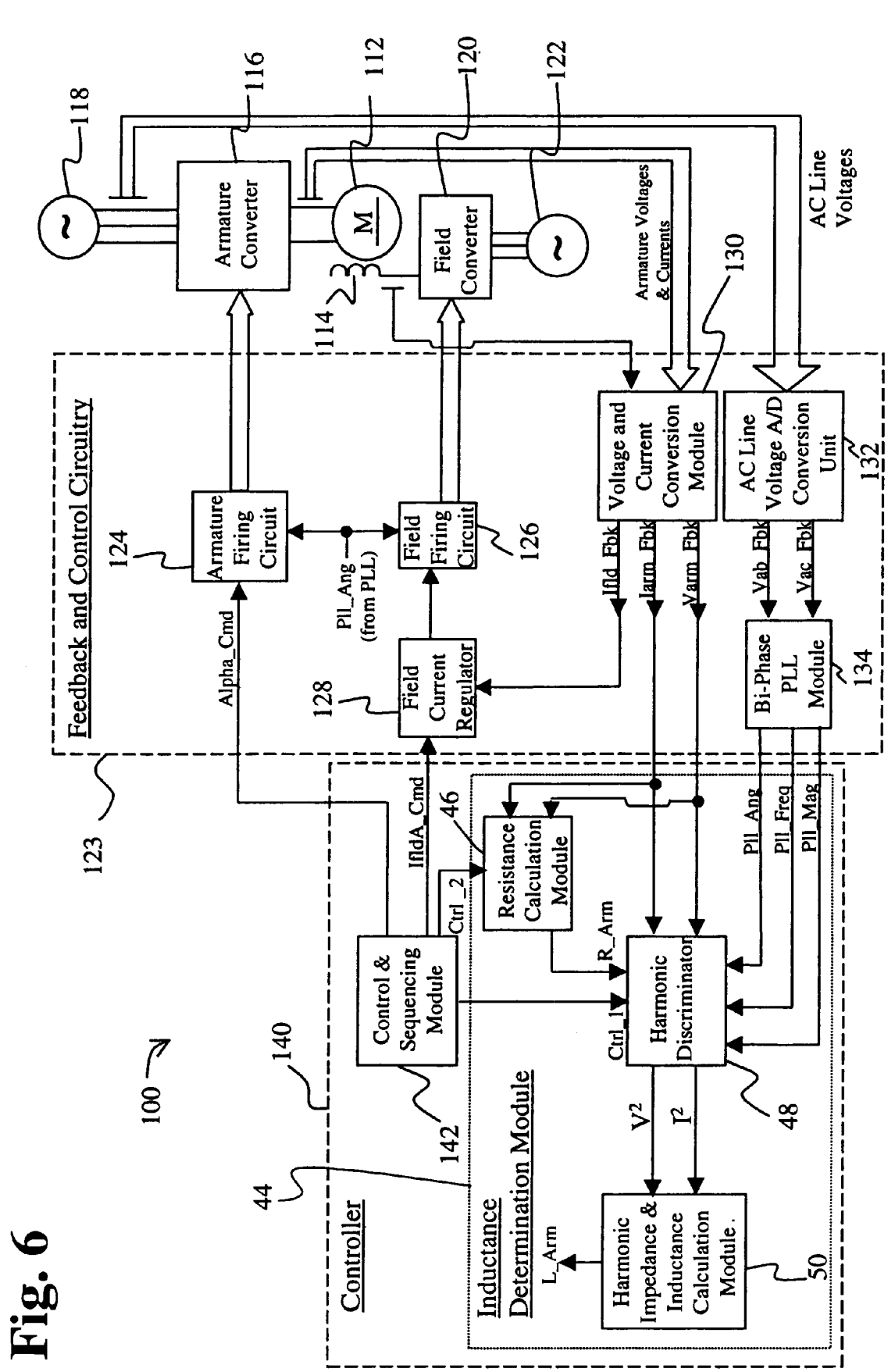
FIG. 6 is a more detailed block diagram of the electric motor system depicted in the block diagram of FIG. 5.

The motor/control system 100 will now be discussed in more detail. As shown in FIG. 6, the feedback and control circuitry 123 includes a voltage and current conversion module 130 that converts voltage and current measurements to digital feedback signals. The armature voltage and current are converted to an armature voltage feedback signal (Varm_Fbk) and an armature current feedback signal (Iarm_Fbk), respectively using a combination of current shunts and analog to digital (A/D) converters as is well known in the art. Field current is converted to a field current feedback signal (Ifld_Fbk).

As in the previous embodiments, the feedback and control circuitry 123 also includes a line voltage analog to digital conversion unit 132 that converts analog signals to digital voltage feedback signals (Vab_Fbk and Vac_Fbk). These signals are used by a bi-phase, phase-lock loop (PLL) module 134 to produce effective source phase angle (Pll_Ang), frequency (Pll_Freq) and voltage (Pll_Mag) signals. The Pll_Ang signal is used by the armature firing circuit 124 and the field firing circuit 126 to coordinate and adjust converter firing time signals.

The armature converter 116 includes a thyristor bridge circuit configured to provide a predetermined number (N) of pulses per AC source cycle. The firing rate and sequence is controlled by the armature firing circuit 124 based on a firing angle command (Alpha cmd) provided by the control and sequencing module 142. Based on this command and on feedback of the AC source phase angle, the armature firing circuit 124 provides thyristor gate states and firing times to the armature converter 116.

The field firing circuit 126 provides similar gate and firing information to the field converter 120. The field firing circuit 126, however, receives a command signal from a field current regulator 128 rather than directly from the control and sequencing module 142. The field current regulator 128 performs a comparison of the measured field current and a field current command signal provided by the control and sequencing module 142 and adjusts the command signal to the field firing circuit 126 accordingly.

The control and sequencing module 142 can be configured to provide predetermined armature firing angle and field current commands upon commissioning or can be programmed for interactive input of firing angle and field current.

As before, the control and sequencing module 142 determines the number and frequency of resistance values to average. A control signal (Ctrl_2) from the control and sequencing module 142 is used to turn the resistance calculation module 46 on and off at the appropriate sample times. The resistance calculation module 46 can be deleted or bypassed if it is determined that the armature resistance value will be negligible compared to the Nth harmonic impedance value. Alternatively a fixed resistance value can be loaded into the controller 140 for use by the inductance determination module 44.

The harmonic discriminator 48 uses the relationships of Equations 6 and 7 to calculate the squares of the Nth harmonic armature voltage and Nth harmonic armature current. The calculations are made periodically over a predetermined time interval as commanded by the control and sequencing module 42 through a control signal (Ctrl_1). The harmonic discriminator 48 uses armature voltage and current feedback values from the voltage and current conversion module 130 and source phase angle values from the PLL module 134.

The impedance/inductance calculation module 50 uses the squares of the Nth harmonic armature voltage and current to compute the Nth harmonic impedance using Equation 4. If the Nth harmonic impedance is desired only as an interim calculation, the impedance calculator need only calculate the square of the Nth harmonic impedance, which can be entered directly into the inductance calculation.

The impedance/inductance calculation module 50 uses the square of the Nth harmonic impedance, the frequency of the AC armature source 118, the output resistance (R_arm) of the resistance calculation module 46, and the relationship of Equation 3 to calculate the inductance of the armature 112 for the field current applied. The source frequency used can either be a pre-set value or the frequency provided by the PLL module 134.

If armature resistance is not available or is not to be used, the impedance/inductance calculation module 50 calculates the Nth harmonic voltage and current by calculating the square roots of the value obtained using Equations 6 and 7. The armature inductance is then determined using the Nth harmonic voltage and current values, the frequency of the AC armature source 118 and the relationship of Equation 10 to calculate the inductance of the armature 112 for the field current applied.

Figure 7:
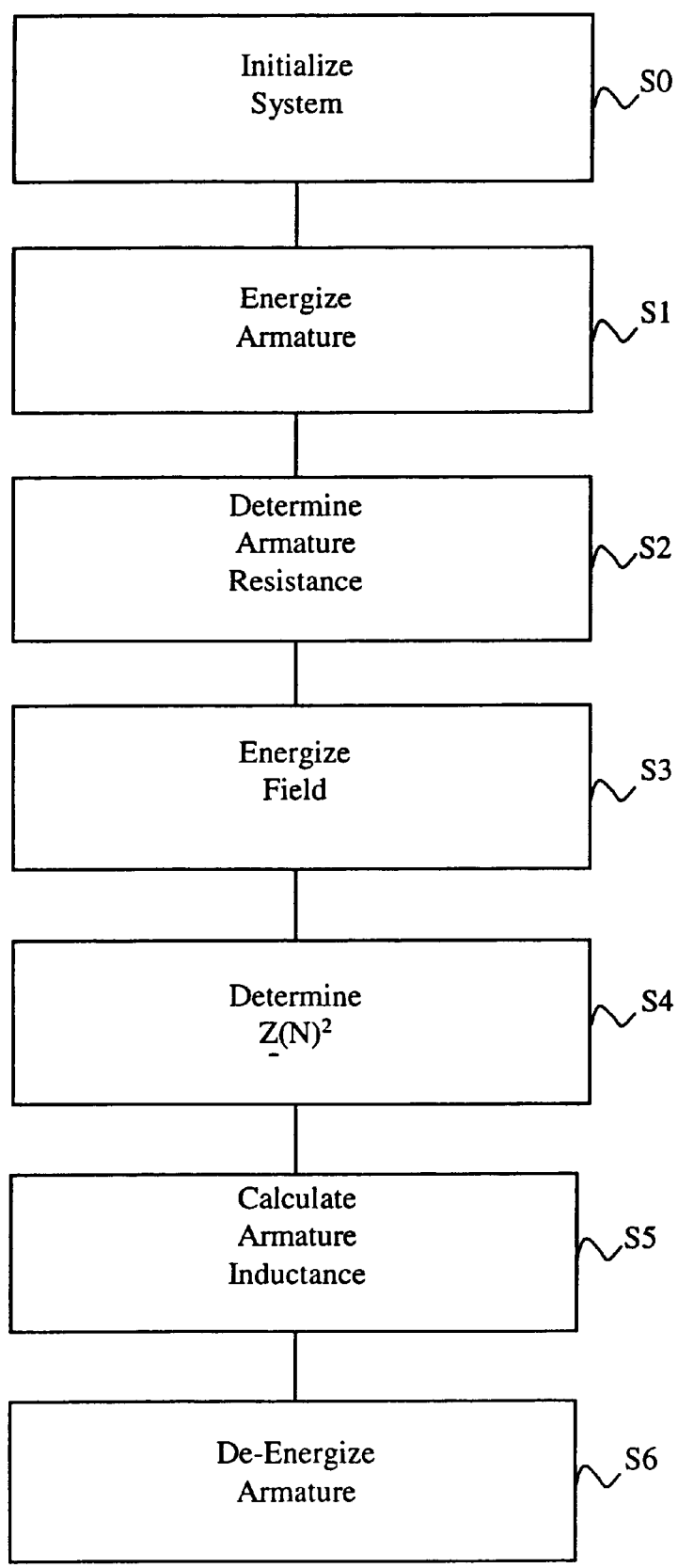
FIG. 7 is a flowchart of the steps of a method according to one embodiment of the invention.

If the armature resistance is to be obtained, determination of the inductance of the armature 112 requires the basic steps shown in FIG. 7. Initially, at step S0, neither the armature 112 nor the field winding 114 is energized and all voltage and current feedback offsets are nulled. At step S1, the armature 112 is energized by the armature converter 116, which uses a constant firing angle supplied to the armature firing circuit 124 by the controller 140. At step S2, the control and sequencing module 42 commands the resistance calculation module 46 to determine armature resistance. At step S3, the field winding 114 is energized by the field converter 120 to a current level supplied by the controller 40 to the field current regulator 128. At steps S4 and S5, the control and sequencing module 42 commands the inductance determination module 44 to determine the harmonic impedance squared and the armature inductance, respectively. Step S4 includes determining values for inductive element voltage and current and for the equivalent source phase angle based on measurements taken at regular periodic intervals. At step S6, the armature is de-energized.

As previously noted, for Nth harmonic impedance determination, the theoretical minimum requirement would be to obtain samples for 1/N cycles. In order to reduce error potential due to noise disturbance, however, it is preferred that data be obtained for 3/N cycles. As a result, the length of time that the armature 112 and the field winding 114 are simultaneously energized need only be 3/N cycles. For a six-pulse, 60 Hertz system this is about 8 milliseconds.

Unfortunately, the field winding 114 cannot be energized as quickly as the armature 112. This is because the current response of the field winding 114 is much slower than that of the armature 112 due to its large time constant. In order to minimize the time interval over which the energized armature 112 interacts with an energized field, it is preferable to de-energize the armature 112 before energizing the field winding 114. Once the field winding 114 has reached the desired operational current level, the armature 112 can be re-energized for a time interval equivalent to 3/N cycles for measurement of the harmonic parameters needed for armature inductance determination. By energizing the armature 112 for such a short duration, the average rotational force on the motor shaft is kept to a minimum. A duration less than one cycle will typically result in negligible shaft movement. In addition, measurements can be made at a lower field current level, which further reduces the torque.

Figure 8:
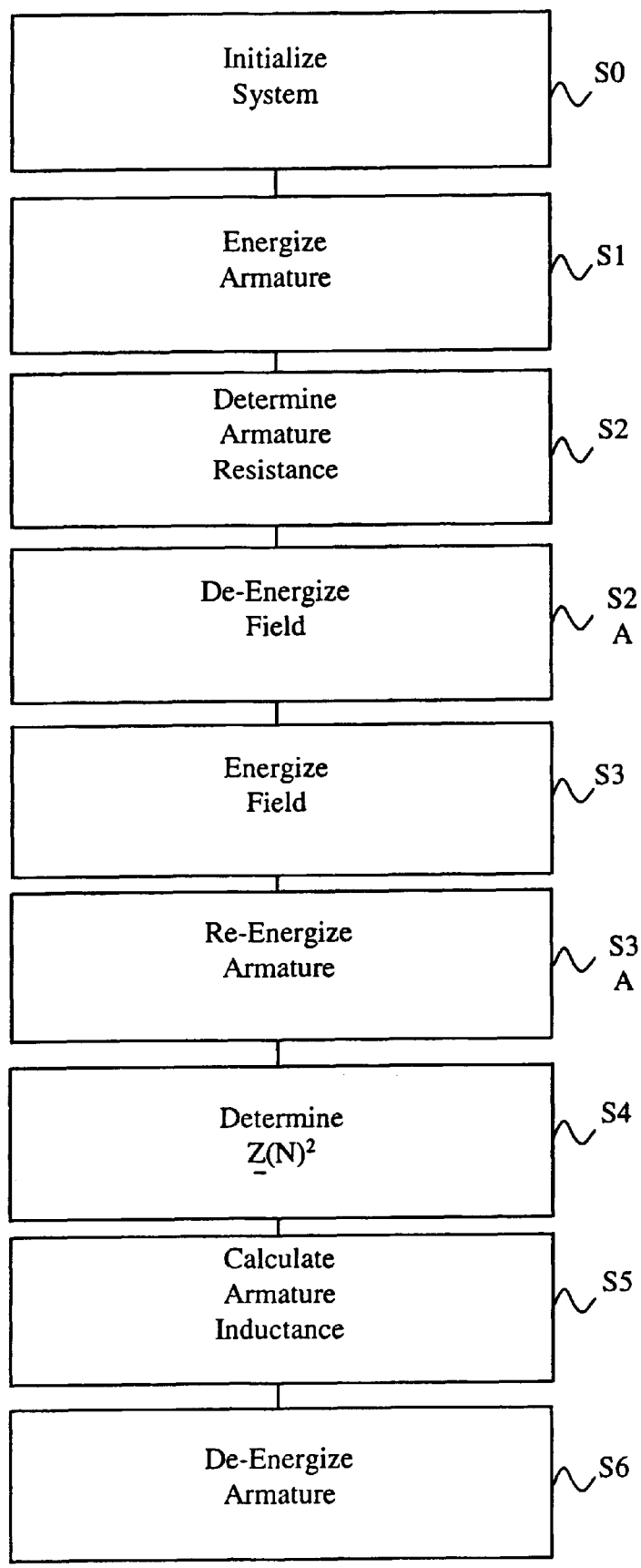
FIG. 8 is a flowchart of the steps of a method according to one embodiment of the invention.

FIG. 8 illustrates a method with the additional steps required to assure a minimum measurement time interval. The additional steps are S2A (de-energize armature) and S3A (re-energize armature). Steps S0–S2, S3 and S4–S6 are unchanged. The measurement time interval is the interval between steps S3A and S6.

It will be understood by those having ordinary skill in the art that the firing angle used in the inductance determination portion of the method need not be the same as that used in the resistance determination portion. The firing angle for the inductance determination should be sized to maximize the armature voltage and current output within the constraint that the torque on the shaft must be small enough that the shaft does not move.

It will be also be understood by those of ordinary skill in the art that once the resistance determination has been made, steps S3–S6 can be repeated for different field current levels. This allows the development of an empirical description of the variation in armature inductance with field current for the motor/control system 100. This can then be used to extrapolate to other field current levels.

The steps of the methods according to the present invention need not be carried out in the order shown in FIGS. 4 and 5. It will be understood, for example, that step S5 may be conducted after step S6. Also, the resistance determination need not be carried out before the determination of the Nth harmonic impedance. Thus, steps S3, S3A and S4 may be carried out before steps S1, S2 and S2A. Such an approach would merely require that the field be de-energized before initiating step S1.

Figure 9:
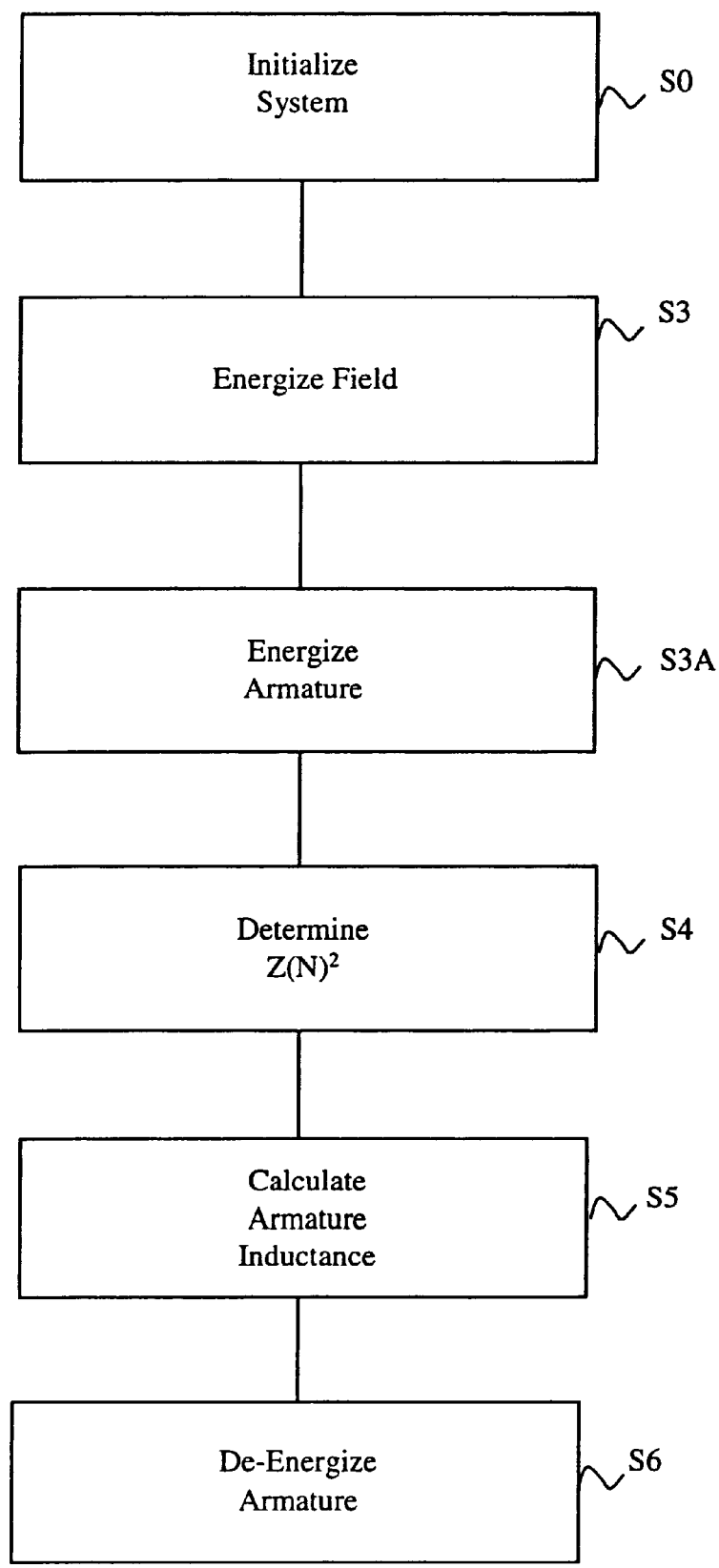
FIG. 9 is a flowchart of the steps of a method according to one embodiment of the invention.

If armature resistance need not be determined, the basic steps of the method are reduced to those shown in FIG. 9. Steps S3 through S6 can be repeated for as many field current levels as desired.

Figure 10:
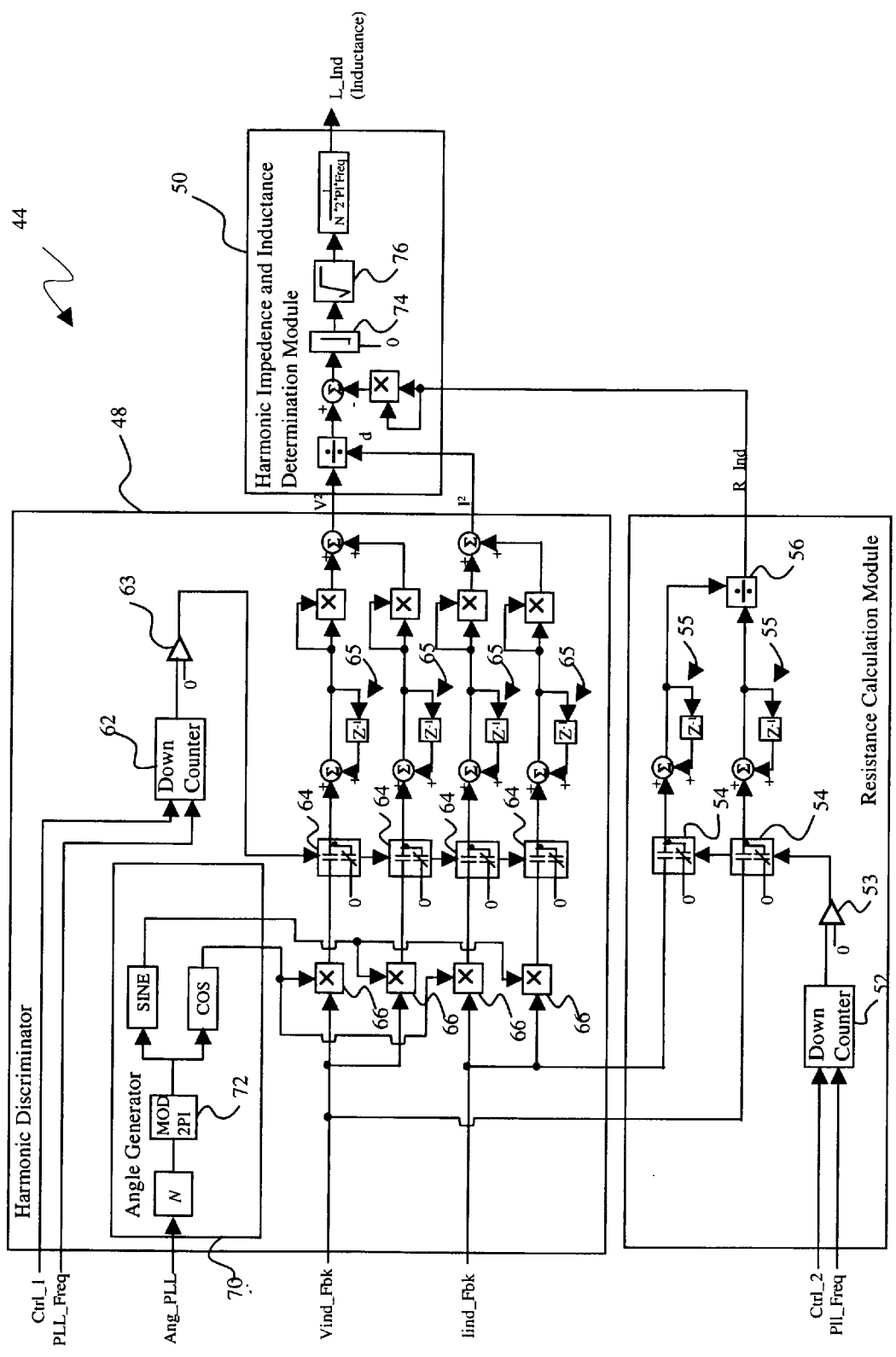
FIG. 10 is a block diagram of the inductance determination module of an electric motor system according to an embodiment of the present invention.

It will be understood that the inductance determination module 44 can be used without modification to calculate inductance for any inductive element. FIG. 10 is a block diagram of an inductance determination module 44 illustrating the calculations made in implementing the methods of the present invention. The resistance calculation is performed based on inductive element voltage and current measurements made during step SI-2 or S2. The control and sequencing module controls the timing of the calculation steps using control signal Ctrl_2. A down counter 52 uses pre-set values for data samples per second and number of cycles of data desired along with the source frequency to compute an integer value for the number of resistance calculations to be made. When the Ctrl_2 signal is true, the down counter 52 begins to count downward from the number of calculations to be integrated. A comparator 53 compares the count to zero and sends a signal to a pair of switches 54. As long as the output of down counter 52 is not zero, the output of comparator 53 will be a 1 and the switches 54 will allow armature voltage and current values to be accumulated and integrated by integrators 55. When the output of down counter 52 reaches zero, its output will remain at zero until reset for a new series of calculations. The output of the comparator 53 changes to zero, which causes the output of switches 54 to be zero. This freezes the output of the integrators 55 at final values for voltage and current. The two values are passed to a division function 56, which calculates the resistance of the inductive element.

Nth harmonic impedance calculations are carried out during step S4. When commanded by the control and sequencing module, the harmonic discriminator 48 determines the Nth harmonic voltage and Nth harmonic current, computes their squares and passes them to the harmonic impedance and inductance module 50.

The harmonic discriminator 48 requires a frequency lock to the higher order harmonic component of interest. The angle generator 70 accomplishes this using the effective source phase angle (Ang_PLL), which has been synchronized to the source fundamental voltage by the phase-lock loop module. Ang_PLL is multiplied by N(the number of converter pulses per source AC cycle) and modulated to a value between zero and two pi by a modulation function 72. The output of the modulation function is an angle that can be used to determine the Nth harmonic components of the inductive element voltage and current. This angle is then passed through sine and cosine functions. The resulting values are then sent to multipliers 66 where they are multiplied by the feedback voltage and current values to produce the two components of the Nth harmonic voltage and the two components of the Nth harmonic current. These components are then passed to switches 64.

The timing of the calculation steps is accomplished using control signal Ctrl_1. A down counter 62 uses pre-set values for data samples per second and number of cycles of data desired along with the source frequency to compute an integer value for the number of impedance calculations to be made. As discussed below, the total interval is preferably about 3/N cycles. When the Ctrl_1 signal is true, the down counter 62 begins to count downward from the number of calculations to be integrated. A comparator 63 compares the count to zero and sends a signal to the switches 64. As long as the output of down counter 62 is not zero, the output of comparator 63 will be a 1 and the switches 64 will allow the Nth harmonic voltage and current components to be accumulated and integrated by integrators 65. When the output of down counter 62 reaches zero, its output will remain at zero until reset for a new series of calculations. The output of the comparator 63 then changes to zero, which causes the output of switches 64 to be zero. This freezes the output of the integrators 65 at final values for the Nth harmonic voltage and current components. The Nth harmonic voltage and current components are then squared and summed to produce the Nth harmonic voltage squared and the Nth harmonic current squared.

The harmonic impedance and inductance module 50 divides the Nth harmonic voltage squared by the Nth harmonic current squared to obtain the Nth harmonic impedance squared, per Equation 4. If the Nth harmonic impedance is a desired output, step S4 can include finding the square root to determine the impedance value.

To calculate inductance, the inductive element resistance from the resistance calculation module 46 is squared and subtracted from the Nth harmonic impedance squared. The result is passed through a limit function 74 and a square root function 76. The limit function 74 sets any negative values to zero but does not affect values greater than or equal to zero. The output of the limit function 74 is then divided by (N2 II times source frequency) to determine the inductance of the inductive element(L_Ind).

It will be understood that the calculations are simplified if the armature resistance is not determined or is to be ignored.

As noted above, the data acquisition and calculation methodology of the present invention converges on a solution for armature inductance so quickly that in the motor/control system 100, the armature 112 and field winding 114 need be simultaneously energized for only 3/N cycles. With an optimally selected firing angle, the resulting torque on the motor shaft can be kept below the torque that would cause significant shaft movement. As a result there is no need to lock the shaft in place during inductance determination. In addition, the method and system of the present invention can readily provide inductance data for additional field current values by merely repeating steps S3 to S6 for each field current of interest.

Figure 11:
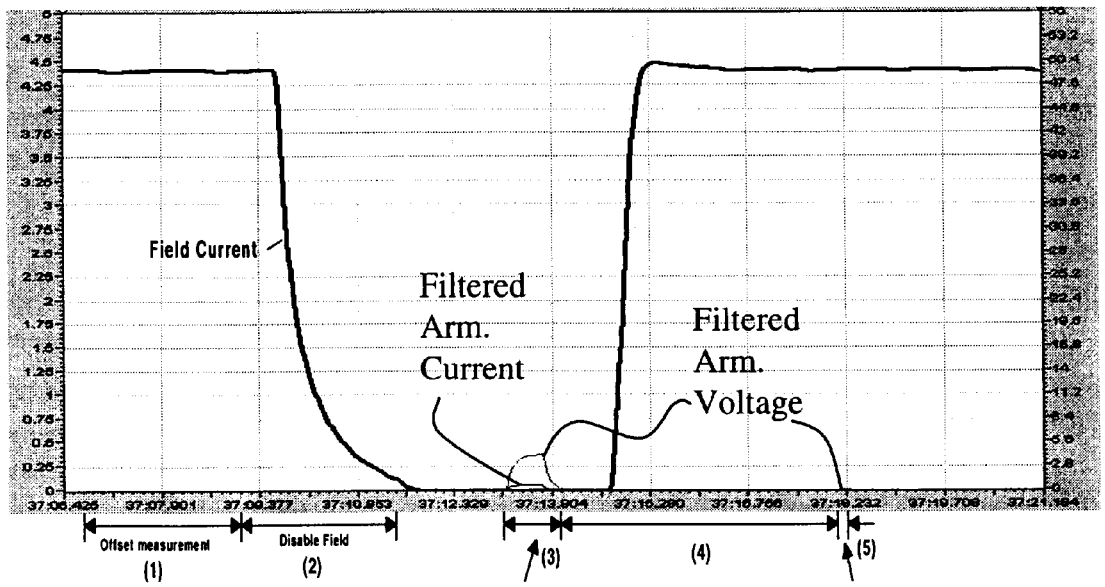
FIG. 11 is a graphical representation of field current, filtered armature voltage and filtered armature current versus time for a motor during the execution of a method according to an embodiment of the present invention.
Figure 12:
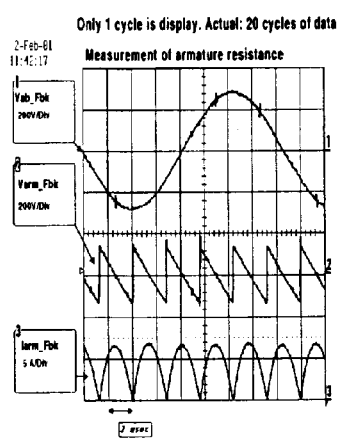
FIG. 12 is a graphical representation of source voltage, armature voltage and armature current versus time during the resistance measurement portion of the method graphically depicted in FIG. 11.
Figure 13:
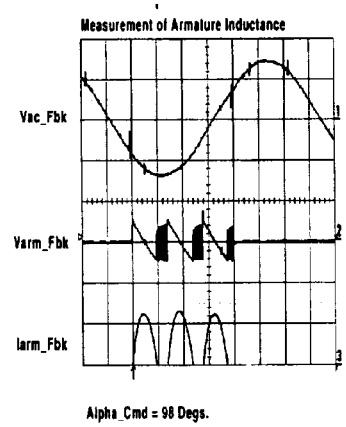
FIG. 13 is a graphical representation of source voltage, armature voltage and armature current versus time during the inductance determination portion of the method graphically depicted in FIG. 11.

FIG. 11 illustrates for a typical motor system according to the present invention the field current, filtered armature current and filtered armature voltage versus time during an execution of a method of the present invention. During time interval 1, the field current is energized for offset measurement. During time interval 2, the field current is disabled and the offsets nulled. The armature is then energized for resistance determination over time interval 3 using a thyristor firing angle of 90 degrees. FIG. 12 shows one cycle of unfiltered armature voltage and current data from time interval 3 and illustrates the six-pulse response to the armature converter. After 20 cycles, the armature is de-energized. The field current is re-energized during time interval 4. At time interval 5, the armature is energized for 3/N or one half cycle using a 98 degree firing angle. FIG. 13 illustrates the unfiltered response data obtained during interval 5. These data were used for the inductance calculations of the method.

Figure 14:
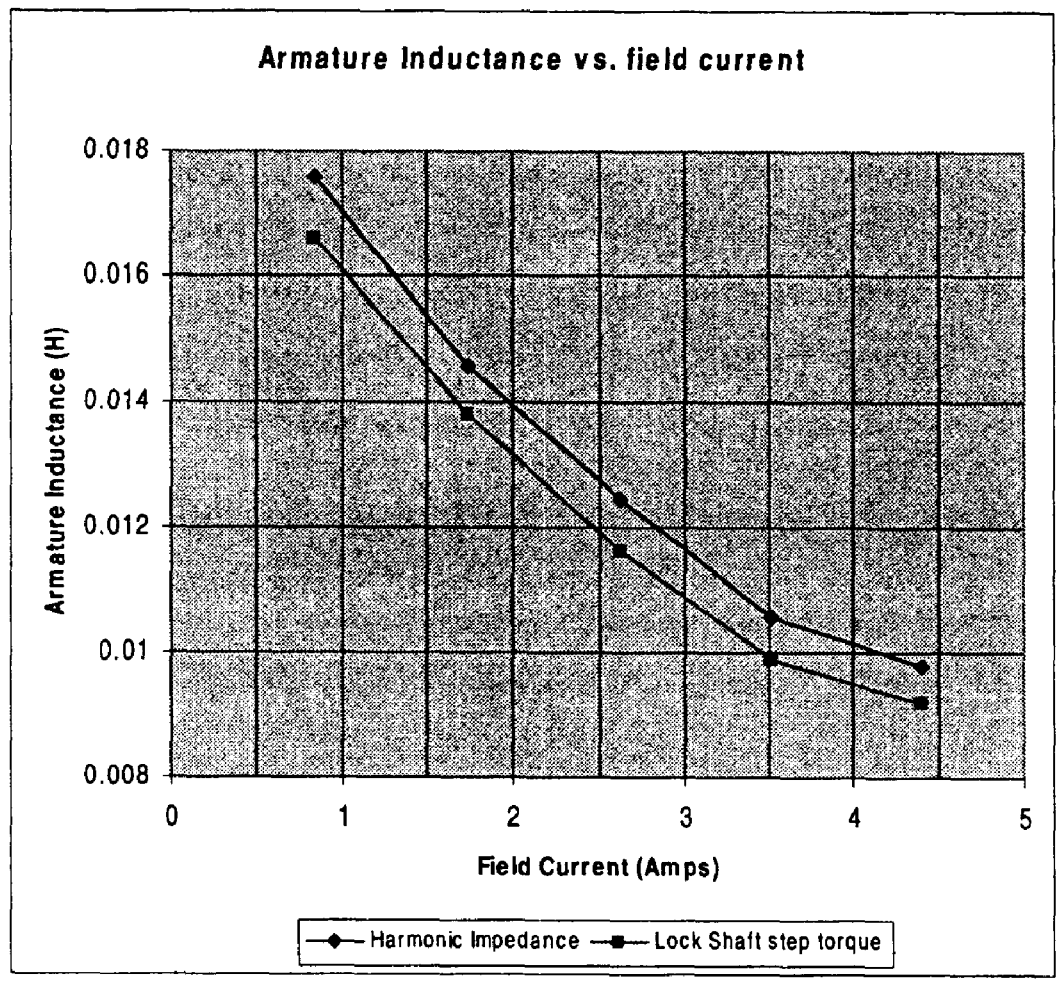
FIG. 14 is a graphical representation of armature inductance determination results using the present method and using the locked shaft method.

FIG. 14 presents a comparison of armature inductance results using the present invention and results using the locked shaft method for a typical 15 HP separately excited DC motor. For this motor, the two methods provide inductance measurements that differ by less than about 6% at a field current level of 4 amps. Thus, the present invention provides comparable results while presenting a significantly more convenient, less time-consuming and less costly methodology. Further, the present method provides a vast improvement over operational inductance estimates derived from measurements taken with no field current.

It will be understood that the present invention has a wide range of application. The methods of the present invention may be implemented by a separate inductance determination system or by the incorporation of such a system into a motor control system. The methods can be applied to any inductor or DC motor driven by an AC to DC converter. For inductive elements not ordinarily driven by such a converter, an AC to DC converter can be made a part of the determination system.

For determination of armature inductance, assuming that the inductance is not so large that the harmonic current level is indistinguishable, the only significant limitation of the method relates to the speed of the data sensors and the data acquisition system. The system must be capable of measuring at least about six data points per pulse or about every 15 degrees of source phase angle. This typically provides sufficient resolution for computing the Nth harmonic voltage and current components in a measurement time interval short enough to avoid significant shaft movement.

While the foregoing description includes many details and specificities, it is to be understood that these have been included for purposes of explanation only, and are not to be interpreted as limitations of the present invention. Many modifications to the embodiments described above can be made without departing from the spirit and scope of the invention, as is intended to be encompassed by the following claims and their legal equivalents.

What is claimed is:

1. A method of determining an inductance value of an inductive element, the method comprising:
   energizing the inductive element using an N-pulse AC to DC inductive element converter in electrical communication with the inductive element and an AC source;
   determining at each of a plurality of periodic time intervals an inductive element voltage value, an inductive element current value, and an equivalent source phase angle;
   determining an Nth harmonic impedance squared value for the inductive element using the inductive element voltage and current values and the equivalent source phase angles; and
   calculating the inductive element inductance value from the Nth harmonic impedance squared value and an AC source frequency value.

2. A method according to claim 1 further comprising
   de-energizing the inductive element after a time interval no greater than a predetermined number of cycles of the AC source.

3. A method according to claim 1 wherein the inductive element inductance value is determined using the relationship:

$$L_{ind} = \frac{\sqrt{Z(N)^2}}{N(2\pi)f}$$

where

N=a number of converter pulses per source AC cycle;

$L_{ind}$=inductive element inductance value;

$Z(N)^2$=Nth harmonic impedance squared; and $f$=AC source frequency.

4. A method according to claim 1 wherein the step of determining an Nth harmonic impedance squared value includes:

calculating an Nth harmonic inductive element voltage squared value from the inductive element voltage values and the equivalent source phase angles;

calculating an Nth harmonic inductive element current squared value from the inductive element current values and the equivalent source phase angles; and calculating the Nth harmonic impedance squared value from the Nth harmonic voltage squared value and the Nth harmonic current squared value.

5. A method according to claim 4 wherein the Nth harmonic impedance squared value is determined using the relationship:

$$Z(N)^2 = \frac{V(N)^2}{I(N)^2}$$

where

N=a number of converter pulses per source AC cycle;

$Z(N)^2$=Nth harmonic impedance squared;

$V(N)^2$=Nth harmonic inductive element voltage squared; and $I(N)^2$=Nth harmonic inductive element current squared.

6. A method according to claim 4 wherein the Nth harmonic inductive element voltage squared is determined using the relationship:

$V(N)^2 = [\Sigma_{i=0}^{i=m}[V_i \cos(min_{2\pi}(N\alpha_i))]]^2 + [\Sigma_{i=0}^{i=m}[V_i \sin(mod_{2\pi}(N\alpha_i))]]^2$;

and the Nth harmonic inductive element current squared is determined using the relationship:

$I(N)^2 = [\Sigma_{i=0}^{i=m}[I_i \cos(mod_{2\pi}(N\alpha_i))]]^2 + [\Sigma_{i=0}^{i=m}[I_i \sin(mod_{2\pi}(N\alpha_i))]]^2$;

where $V(N)^2$=Nth harmonic inductive element voltage squared;

$I(N)^2$=Nth harmonic inductive element current squared;

N=a number of converter pulses per source AC cycle;

i=an integer time interval counter varying from 0 to m;

m=a number of periodic time intervals;

$V_i$=ith inductive element voltage value;

$\alpha_i$=ith equivalent source phase angle; and $I_i$=ith inductive element current.

7. A method according to claim 1 further comprising:

determining at each of a second plurality of periodic time intervals a resistance calculation voltage value, a resistance calculation current value, determining an inductive element resistance value using the resistance calculation voltage values and the resistance calculation current values.

8. A method according to claim 7 wherein the inductive element inductance value is determined using the relationship:

$$L_{ind} = \frac{\sqrt{Z(N)^2 - R_{ind}^2}}{N(2\pi)f}$$

where

N=a number of converter pulses per source AC cycle;

$L_{ind}$=inductive element inductance value;

$R_{ind}$=inductive element resistance value;

$Z(N)^2$=Nth harmonic impedance squared; and $f$=AC source frequency.

9. A method according to claim 1 wherein the inductive element is an inductor.

10. A method according to claim 1 wherein the inductive element is an armature operatively associated with a field winding, the method further comprising:

producing a predetermined field current level in the field winding.

11. A method of determining an inductance value of an armature, the method comprising:

producing a predetermined field current level in a field winding operatively associated with the armature;

energizing the armature using an N-pulse AC to DC armature converter in electrical communication with the armature and an AC source;

determining at each of a plurality of periodic time intervals an armature voltage value, an armature current value, and an equivalent source phase angle;

determining an Nth harmonic impedance squared value for the armature using the armature voltage values, the armature current values and the equivalent source phase angles; and calculating the armature inductance value from the Nth harmonic impedance squared value and an AC source frequency value.

12. A method according to claim 11 further comprising de-energizing the armature after a time interval no greater than a predetermined number of cycles of the AC source.

13. A method according to claim 12 wherein the predetermined number is 1.

14. A method according to claim 12 wherein the predetermined number is about 3/N, where N is a number of converter pulses per cycle of the AC source.

15. A method according to claim 12 wherein the armature is operatively associated with an unlocked motor shaft that remains substantially motionless during the time interval when the armature is energized.

16. A method according to claim 11 wherein the armature inductance value is determined using the relationship:

$$L_{arm} = \frac{\sqrt{Z(N)^2}}{N(2\pi)f}$$

where

N=a number of converter pulses per source AC cycle;

$L_{arm}$=armature inductance value;

$Z(N)^2$=Nth harmonic impedance squared; and $f$=AC source frequency.

17. A method according to claim 11 wherein the step of determining an Nth harmonic impedance squared value includes:
    calculating an Nth harmonic armature voltage squared value from the armature voltage values and the equivalent source phase angles;
    calculating an Nth harmonic armature current squared value from the armature current values and the equivalent source phase angles; and
    calculating the Nth harmonic impedance squared value from the Nth harmonic voltage squared value and the Nth harmonic current squared value.

18. A method according to claim 17 wherein the Nth harmonic impedance squared value is determined using the relationship:

$$Z(N)^2 = \frac{V(N)^2}{I(N)^2}$$

where
    N=a number of converter pulses per source AC cycle;
    $Z(N)^2$=Nth harmonic impedance squared;
    $V(N)^2$=Nth harmonic armature voltage squared; and
    $I(N)^2$=Nth harmonic armature current squared.

19. A method according to claim 17 wherein the Nth harmonic voltage squared is determined using the relationship:

$$V(N)^2 = [\Sigma_{i=0}^{i=m}[V_i \cos(mod_{2\pi}(N\alpha_i))]]^2 + [\Sigma_{i=0}^{i=m}[V_i \sin(mod_{2\pi}(N\alpha_i))]]^2;$$

and the Nth harmonic current squared is determined using the relationship:

$$I(N)^2 = [\Sigma_{i=0}^{i=m}[I_i \cos(mod_{2\pi}(N\alpha_i))]]^2 + [\Sigma_{i=0}^{i=m}[I_i \sin(mod_{2\pi}(N\alpha_i))]]^2;$$

where
    $V(N)^2$=Nth harmonic armature voltage squared;
    $I(N)^2$=Nth harmonic armature current squared;
    N=a number of converter pulses per source AC cycle;
    i=an integer time interval counter varying from 0 to m;
    m=a number of periodic time intervals;
    $V_i$=ith armature voltage value;
    $\alpha_i$=ith equivalent source phase angle; and
    $I_i$=ith armature current.

20. A method according to claim 17 wherein a total duration of the step of determining at each of a plurality of periodic time intervals an armature voltage value, an armature current value, and an equivalent source phase angle is no greater than a cycle time interval equal to about one cycle of a fundamental wave form of the AC source.

21. A method according to claim 17 wherein a total duration of the step of determining at each of a plurality of periodic time intervals an armature voltage value, an armature current value, and an equivalent source phase angle is no greater than a cycle time interval equal to about 3/N times one cycle of a fundamental wave form of the AC source.

22. A method according to claim 11 further comprising:
    determining an armature resistance value using a second set of measured armature voltage and current values obtained with the armature energized and the field winding de-energized.

23. A method according to claim 22 wherein the armature inductance value is determined using the relationship:

$$L_{arm} = \frac{\sqrt{Z(N)^2 - R_{arm}^2}}{N(2\pi)f}$$

where
    N=a number of converter pulses per source AC cycle;
    $L_{arm}$=armature inductance value;
    $R_{arm}$=armature resistance value;
    $Z(N)^2$=Nth harmonic impedance squared; and
    $f$=AC source frequency.

24. A method of determining an inductance value of an armature, the method comprising:
    energizing the armature using an N-pulse AC to DC armature converter in electrical communication with the armature and an AC source;
    determining at each of a plurality of first periodic time intervals a non-energized field armature voltage value and a non-energized field armature current value;
    calculating for each periodic time interval a time interval resistance value;
    determining an armature resistance value by averaging the time interval resistance values;
    de-energizing the armature after determining the armature resistance value;
    producing a predetermined field current level in a field winding operatively associated with the armature;
    energizing the armature for a measurement time interval after the step of producing a predetermined field current, the measurement time interval being no greater than a duration of a predetermined number of cycles of the AC source;
    determining at each of a plurality of second periodic time intervals an energized field armature voltage value, an energized field armature current value, and an equivalent source phase angle;
    determining an Nth harmonic impedance squared value for the armature using the energized field armature voltage values, the energized field armature current values and the equivalent source phase angles; and
    calculating an armature inductance value from the Nth harmonic impedance squared value, the armature resistance value and an AC source frequency value.

25. A method according to claim 24 wherein the predetermined number of cycles is one.

26. A method according to claim 24 wherein the predetermined number of cycles is 3/N, where N is a number of converter pulses per cycle of the AC source.

27. A method according to claim 24 wherein the armature inductance is determined using the relationship:

$$L_{arm} = \frac{\sqrt{Z(N)^2 - R_{arm}^2}}{N(2\pi)f}$$

where
    N=a number of converter pulses per source AC cycle;
    $Z(N)^2$=Nth harmonic impedance squared;
    $L_{arm}$=armature inductance value;
    $R_{arm}$=armature resistance value; and
    $f$=AC source frequency.

28. A method according to claim 24 wherein the step of determining an Nth harmonic impedance squared value includes:
calculating an Nth harmonic armature voltage squared value from the armature voltage values and the equivalent source phase angles;
calculating an Nth harmonic armature current squared value from the armature current values and the equivalent source phase angles; and
calculating the Nth harmonic impedance squared value from the Nth harmonic voltage squared value and the Nth harmonic current squared value.

29. A method according to claim 28 wherein the Nth harmonic impedance squared value is determined using the relationship:

$$Z(N)^2 = \frac{V(N)^2}{I(N)^2}$$

where
N=a number of converter pulses per source AC cycle;
$Z(N)^2$=Nth harmonic impedance squared;
$V(N)^2$=Nth harmonic armature voltage squared; and
$I(N)^2$=Nth harmonic armature current squared.

30. A method according to claim 28 wherein the Nth harmonic voltage squared is determined using the relationship:

$$V(N)^2 = [\Sigma_{i=0}^{i-m}[V_i \cos(mod_{2\pi}(N\alpha_i))]]^2 + [\Sigma_{i=0}^{i-m}[V_i \sin(mod_{2\pi}(N\alpha_i))]]^2;$$

and the Nth harmonic current squared is determined using the relationship:

$$I(N)^2 = [\Sigma_{i=0}^{i-m}[I_i \cos(mod_{2\pi}(N\alpha_i))]]^2 + [\Sigma_{i=0}^{i-m}[I_i \sin(mod_{2\pi}(N\alpha_i))]]^2;$$

where
$V(N)^2$=Nth harmonic armature voltage squared;
$I(N)_2$=Nth harmonic armature current squared;
N=a number of converter pulses per source AC cycle;
i=an integer time interval counter varying from 0 to m;
m=a number of periodic time intervals;
$V_i$=ith armature voltage value;
$\alpha_i$=ith equivalent source phase angle; and
$I_i$=ith armature current.

31. A method according to claim 24 wherein the armature is operatively associated with an unlocked motor shaft that remains substantially motionless throughout the measurement time interval.

32. A system for determining an inductance of an inductive element, the system comprising:
an N-pulse AC to DC converter having a plurality of interconnected thyristors, the converter being connectable to the inductive element and to an AC source so as to be in electrical communication with the inductive element and the AC source;
means for controlling a firing of the thyristors in the converter to produce an inductive element voltage and an inductive element current;
means for periodically determining an inductive element resistance from first measured inductive element voltage and current values;
means for determining an Nth harmonic impedance squared value for the inductive element from second measured armature voltage and current values and from measured AC source voltage values; and
means for determining inductive element inductance from the Nth harmonic impedance squared value.

33. A system according to claim 32 wherein the means for determining an Nth harmonic impedance squared value includes:
means for periodically determining the second measured armature voltage and current values; and
means for periodically determining an equivalent source phase angle from the measured AC source voltage values;
wherein the means for determining an Nth harmonic impedance squared value uses the relationship:

$$Z(N)^2 = \frac{V(N)^2}{I(N)^2}$$

where
N=a number of converter pulses per source AC cycle;
$Z(N)^2$=Nth harmonic impedance squared;
$V(N)^2$=Nth harmonic inductive element voltage squared; and
$I(N)^2$=Nth harmonic inductive element current squared.

34. A system according to claim 33 wherein the means for determining an Nth harmonic impedance squared value uses the relationships:

$$V(N)^2 = [\Sigma_{i=0}^{i-m}[V_i \cos(mod_{2\pi}(N\alpha_i))]]^2 + [\Sigma_{i=0}^{i-m}[V_i \sin(mod_{2\pi}(N\alpha_i))]]^2;$$

and the Nth harmonic current squared is determined using the relationship:

$$I(N)^2 = [\Sigma_{i=0}^{i-m}[I_i \cos(mod_{2\pi}(N\alpha_i))]]^2 + [\Sigma_{i=0}^{i-m}[I_i \sin(mod_{2\pi}(N\alpha_i))]]^2;$$

where
$V(N)^2$=Nth harmonic armature voltage squared;
$I(N)^2$=Nth harmonic armature current squared;
N=a number of converter pulses per source AC cycle;
i=an integer time interval counter varying from 0 to m;
m=a number of periodic time intervals;
$V_i$=ith inductive element voltage value;
$\alpha_i$=ith equivalent source phase angle; and
$I_i$=ith inductive element current.

35. A system according to claim 32 wherein the means for determining armature inductance uses the relationship:

$$L_{ind} = \frac{\sqrt{Z(N)^2 - R_{ind}^2}}{N(2\pi)f}$$

where
N=a number of converter pulses per source AC cycle;
$L_{ind}$=inductive element inductance value;
$R_{ind}$=inductive element resistance value;
$Z(N)^2$=Nth harmonic impedance squared; and
$f$=AC source frequency.

36. A system for determining an inductance of an inductive element, the system comprising:
an N-pulse AC to DC converter having a plurality of interconnected thyristors, the converter being connectable to the inductive element and to an AC source so as to be in electrical communication with the inductive element and the AC source;

feedback and control circuitry in electrical communication with the converter, the feedback and control circuitry being connectable to the inductive element so as to be in electrical communication therewith and being connectable to the AC source; and a controller in electrical communication with the feedback and control circuitry, the controller including an inductance determination module.

37. A system according to claim 36 wherein the feedback and control circuitry includes:

a firing circuit in electrical communication with the converter;

a voltage and current determination portion connectable to the inductive element and including a voltage and current conversion module configured for converting inductive element voltage and current measurements to inductive element voltage and current feedback signals; and a source voltage determination portion operatively connectable to the AC source and including a line voltage conversion module configured for converting a measurement of the AC source voltage to at least one source voltage feedback signal; and a phase-lock loop module in electrical communication with the line voltage conversion module.

38. A system according to claim 37 wherein the harmonic inductance determination module includes:

a resistance calculation module in electrical communication with the voltage and current conversion module; and a harmonic component discriminator in communication with the voltage and current conversion module, the phase-lock loop module and the resistance calculation module.

39. A system according to claim 38 wherein the controller further includes:

a control and sequencing module in communication with the firing circuit, the resistance calculation module and the harmonic component discriminator.

40. A system for determining an inductance of an inductive element, the system comprising:

an N-pulse AC to DC converter having a plurality of interconnected thyristors, the converter being connectable to the inductive element and to an AC source so as to be in electrical communication with the inductive element and the AC source;

feedback and control circuitry including a firing circuit in electrical communication with the converter, a voltage and current determination portion connectable to the inductive element, a source voltage determination portion operatively connectable to the AC source, and a phase-lock loop module in electrical communication with the source voltage determination portion; and a controller including an inductance determination module including a resistance calculation module in electrical communication with the voltage and current determination portion, a harmonic component discriminator in electrical communication with the voltage and current determination portion, the phase-lock loop module and the resistance determination portion, and a sequencing module in electrical communication with the firing circuit, the resistance calculation module and the inductance determination module.

41. An electric motor system comprising:

an armature operatively associated with a motor shaft;

an N-pulse AC to DC armature converter having a plurality of interconnected thyristors, the armature converter being in electrical communication with the armature and being connectable to an AC source;

a field winding operatively associated with the armature;

means for controlling a firing of the thyristors in the armature converter to produce an armature voltage and an armature current;

means for producing a predetermined field current in the field winding;

means for periodically determining an armature resistance from first measured armature voltage and current values;

means for determining an Nth harmonic impedance squared value for the armature from second measured armature voltage and current values and from measured AC source voltage values; and means for determining armature inductance from the Nth harmonic impedance squared value.

42. An electric motor system according to claim 41 wherein the means for determining an Nth harmonic impedance squared value includes:

means for periodically determining the second measured armature voltage and current values; and means for periodically determining an equivalent source phase angle from the measured AC source voltage values.

43. An electric motor system according to claim 42 wherein the means for determining an Nth harmonic impedance squared value uses the relationship:

$$Z(N)^2 = \frac{V(N)^2}{I(N)^2}$$

where

N=a number of converter pulses per source AC cycle;

$Z(N)^2$=Nth harmonic impedance squared;

$V(N)^2$=Nth harmonic armature voltage squared; and $I(N)^2$=Nth harmonic armature current squared.

44. An electric motor system according to claim 43 wherein the means for determining an Nth harmonic impedance squared value uses the relationships:

$$V(N)^2 = [\Sigma_{i=0}^{i=m}[V_i \cos(mod_{2\pi}(N\alpha_i))]]^2 + [\Sigma_{i=0}^{i=m}[V_i \sin(mod_{2\pi}(\alpha_i))]]^2;$$

and the Nth harmonic current squared is determined using the relationship:

$$I(N)^2 = [\pi_{i=0}^{i=m}[I_i \cos(mod_{2\pi}(N\alpha_i))]]^2 + [\Sigma_{i=0}^{i=m}[I_i \sin(mod_{2\pi}(N\alpha_i))]]^2;$$

where $V(N)^2$=Nth harmonic armature voltage squared;

$I(N)^2$=Nth harmonic armature current squared;

N=a number of converter pulses per source AC cycle;

i=an integer time interval counter varying from 0 to m;

m=a number of periodic time intervals;

$V_i$=ith armature voltage value;

$\alpha_i$=ith equivalent source phase angle; and $I_i$=ith armature current.

45. An electric motor system according to claim 42 wherein the means for determining armature inductance uses the relationship:

$$L_{arm} = \frac{\sqrt{Z(N)^2 - R_{arm}^2}}{N(2\pi)f}$$

where
- N=a number of converter pulses per source AC cycle;
- $Z(N)^2$=Nth harmonic impedance squared;
- $L_{arm}$=armature inductance value;
- $R_{arm}$=armature resistance value; and
- $f$=AC source frequency.

46. An electric motor system according to claim 42 wherein the means for periodically determining the second measured armature voltage and current values is configured to provide at least about six determinations in a time interval equal to 3/N times one cycle of a fundamental AC source wave form.

47. An electric motor system comprising:
- an armature operatively associated with a motor shaft;
- an N-pulse AC to DC armature converter having a plurality of interconnected thyristors, the armature converter being in electrical communication with the armature and being connectable to a first AC source;
- a field winding operatively associated with the armature, the field winding being connected to a field converter that is connectable to a second AC source;
- feedback and control circuitry in electrical communication with the armature converter, the armature and the field winding and connectable to the first AC source; and
- a controller in electrical communication with the feedback and control circuitry, the controller including an armature inductance determination module.

48. An electric motor system according to claim 47 wherein the feedback and control circuitry includes:
- an armature firing circuit in electrical communication with the armature converter;
- a field winding firing circuit in electrical communication with the field converter; and
- an armature voltage and current determination portion in electrical communication with the armature and including an armature voltage and current conversion module configured for converting armature voltage and current measurements to armature voltage and current feedback signals.

49. An electric motor system according to claim 48 wherein the feedback and control circuitry includes:
- a source voltage determination portion operatively connectable to the first AC source and including a line voltage conversion module configured for converting a measurement of the first AC source voltage to at least one source voltage feedback signal; and
- a phase-lock loop module in electrical communication with the line voltage conversion module.

50. An electric motor system according to claim 49 wherein the harmonic inductance determination module includes:
- a resistance calculation module in electrical communication with the armature voltage and current conversion module.

51. An electric motor system according to claim 50 wherein the harmonic inductance determination module includes:
- a harmonic component discriminator in communication with the armature voltage and current conversion module, the phase-lock loop module and the resistance calculation module.

52. An electric motor according to claim 51 wherein the controller further includes:
- a control and sequencing module in communication with the armature firing circuit, the field winding firing circuit, the resistance calculation module and the harmonic component discriminator.

53. An electric motor system comprising:
- an armature operatively associated with a motor shaft;
- an N-pulse AC to DC armature converter having a plurality of interconnected thyristors, the armature converter being in electrical communication with the armature and being connectable to a first AC source;
- a field winding operatively associated with the armature, the field winding being connected to a field converter that is connectable to a second AC source;
- feedback and control circuitry including an armature firing circuit in electrical communication with the armature converter, a field winding firing circuit in electrical communication with the field winding, an armature voltage and current determination portion in electrical communication with the armature, a source voltage determination portion operatively connectable to the first AC source, and a phase-lock loop module in electrical communication with the source voltage determination portion; and
- a controller including an armature inductance determination module including a resistance calculation module in electrical communication with the armature voltage and current determination portion, a harmonic component discriminator in electrical communication with the armature voltage and current determination portion, the phase-lock loop module and the resistance determination portion, and a sequencing module in electrical communication with the armature firing circuit, the field winding firing circuit, the resistance calculation module and the inductance determination module.

* * * * *